United States Patent [19]
Gyure et al.

[11] Patent Number: 5,498,896
[45] Date of Patent: Mar. 12, 1996

[54] HIGH THRESHOLD METAL OXIDE SILICON READ-ONLY-MEMORY TRANSISTORS

[75] Inventors: Alex Gyure, Sunnyvale, Calif.; John Berg, Boise, Id.; Damian Carver, Boise, Id.; Pete Manos, Boise, Id.

[73] Assignee: Zilog, Inc., Campbell, Calif.

[21] Appl. No.: 319,941

[22] Filed: Oct. 7, 1994

Related U.S. Application Data

[62] Division of Ser. No. 179,492, Jan. 7, 1994, Pat. No. 5,389,565.

[51] Int. Cl.$^6$ .................................................. H01L 29/76
[52] U.S. Cl. ..................... 257/402; 257/391; 257/408; 257/344; 257/900
[58] Field of Search ................................. 257/390, 402, 257/391, 408, 344, 900; 365/104

[56] References Cited

U.S. PATENT DOCUMENTS

| | | | |
|---|---|---|---|
| 4,406,049 | 9/1983 | Tam et al. | 257/390 |
| 4,536,944 | 8/1985 | Bracco et al. | 257/390 |
| 4,599,118 | 7/1986 | Han et al. | 437/41 |
| 4,649,629 | 3/1987 | Miller et al. | 257/408 |
| 5,081,052 | 1/1992 | Kobayashi et al. | 257/390 |
| 5,200,802 | 4/1993 | Miller | 257/390 |

FOREIGN PATENT DOCUMENTS 62-84549  4/1987  Japan .

*Primary Examiner*—Robert P. Limanek
*Attorney, Agent, or Firm*—Majestic, Parsons, Siebert & Hsue

[57] ABSTRACT

A method of forming ROM transistor memory cell including not forming lightly doped regions in the semiconductor substrate for some of the memory cells so as to form one type of memory cell and forming the lightly doped regions in another type of memory cell.

14 Claims, 6 Drawing Sheets

HIGH THRESHOLD METAL OXIDE SILICON READ-ONLY-MEMORY TRANSISTORS

This is a division of application Ser. No. 08/179,492, filed Jan. 7, 1994, now U.S. Pat. No. 5,389,565.

BACKGROUND OF THE INVENTION

This invention relates to mask programmable read-only-memory (ROM). Read only memory is more efficient and denser than random access memory. One use for read-only-memory is for storing a microprocessor's microcode. A mask programmable ROM is a read-only-memory whose contents are programmed during the wafer fabrication process.

A mask programmable ROM process is shown in FIG. 1. FIG. 1 is cross-sectional view of a ROM transistor which was produced with a threshold adjust implant. In this process, two types of transistors are formed to produce a read-only-memory circuit. The first type of ROM transistor remains non-conducting at gate voltages of around 5 to 5.5 volts. A threshold adjust implant step sets the transistor's threshold voltage at 5.5 volts. In the threshold voltage adjust step, boron ions are implanted into the channel 2. This threshold adjust implant ensures that the transistor will be off for gate voltages up to 5.5 volts or above. After the channel 2 is doped with the boron ions, a polysilicon line 4 is formed on top of the channel 2. Phosphorous doped regions 6 and Arsenic doped regions 10 are produced in the silicon substrate to form the source and drain.

The other type of ROM transistor has a normal threshold adjust implant in a manner that these transistors have threshold voltages of around 0.8 volts. These transistors will turn on at gate voltages at or below 5 volts. Typically, the threshold voltage for this transistor is in the range 0.5 volts to 1.0 volts.

This method is used for transistor sizes between 1.2 and 2 microns. A disadvantage with this threshold adjust method is that this method does not work well as the semiconductor circuit scales.

Therefore, an object of the present invention is to provide a method of mask programmable ROM transistor fabrication that works well as the semiconductor circuit scales below 1 µm.

SUMMARY OF THE INVENTION

An advantage of the present method and apparatus is that the present method works well as the semiconductor transistor scales from 1.2 µm to 0.8 µm. An additional advantage of the present invention is that the present method works with self aligned implants. Self aligned implants do not require the alignment of the channel with the polysilicon line which is required in the threshold voltage adjust method.

The preferred embodiment of the present invention includes preventing the lightly doped drain region (LDD), hereafter called lightly doped region, from being formed on some of the ROM transistors. The ROM transistors without lightly doped regions will have a high threshold voltage, and programmed as a "zero".

The above advantage is realized by using a method of forming a read-only-memory circuit including memory locations on a silicon substrate. This method comprises forming polysilicon lines at the memory locations; implanting lightly doped regions in the silicon substrate at some, but not all of the memory locations, this lightly doped regions implanting step being self-aligned around the polysilicon lines at some, but not all of the memory locations; forming barrier layers on the polysilicon lines; and implanting heavily doped regions in the silicon substrate at the memory locations, this heavily doped regions implanting step being self-aligned around the barrier layers on the polysilicon lines. A memory cell of one type is formed at some, but not all memory locations where the lightly doped regions are formed and a memory cell of another type are formed at other memory locations where lightly doped regions are not formed.

Additionally, the above objective is realized by using a read-only-memory circuit including a plurality of memory cells on a silicon substrate. This read-only-memory circuit includes polysilicon lines, barrier layers on top of and contacting the polysilicon lines. Additionally, this circuit includes doped regions in the silicon substrate on either side of at least some of the polysilicon lines. The doped regions comprised source and drain regions each including a lightly doped region with donor atoms in the substrate that extends beneath the barrier layer on at least some of the polysilicon lines and a heavily doped region with donor atoms that does not extend beneath at least some of the polysilicon lines. The polysilicon lines near these doped regions act as a gate of a pass transistor. The gate, the source and the drain regions comprise the memory cell of the first type such that when the signal voltage is applied to the gate, the cell of the first type conducts between the source and the drain. The circuit also includes an additional doped region in the silicon substrate on either side of at least some others of the polysilicon lines. Each additional doped region includes an additional heavily doped region with donor atoms in the substrate that does not extend beneath at least some others of the polysilicon lines. Isolation regions exist in the silicon substrate beneath the barrier layers of the at least some others of the polysilicon lines. These isolation regions do not contain substantially more donor atoms than acceptor atoms. The additional doped regions, the isolation regions and at least some others of the polysilicon lines form memory cells of a second type wherein the memory cells of the second type are such that when the signal voltage applies to one of the at least some others of the polysilicon lines, the cell of the second type does not significantly conduct between the additional doped regions.

Alternately, the above advantage is realized by using a method of forming a read-only-memory circuit including memory locations on a silicon substrate. This method comprises forming polysilicon lines at the memory locations. Forming lightly doped regions by implanting donor ions in the silicon substrate at the memory locations. This donor ions implanting step being self-aligned around the polysilicon lines. Implanting acceptor ions into the lightly doped regions at some but not all of the memory locations. This acceptor ions implanting step being self-aligned around the polysilicon lines at the some but not all the memory locations. This method also includes forming barrier layers on the polysilicon lines and implanting heavily doped regions in the silicon substrate at the memory locations. The heavily doped region implanting step being self-aligned around the barrier layers on the polysilicon lines. A memory cell of one type is formed at other memory locations where acceptor atoms are not implanted and a memory cell of another type is formed at the some but not all memory locations where the acceptor ions are implanted.

BRIEF DESCRIPTION OF THE DRAWINGS

The above and other features and aspects of the present invention will become more apparent upon reading the following detailed description in conjunction with the accompanying drawings, in which.

DETAILED DESCRIPTION OF THE PREFERRED EMBODIMENT

Figure 1:
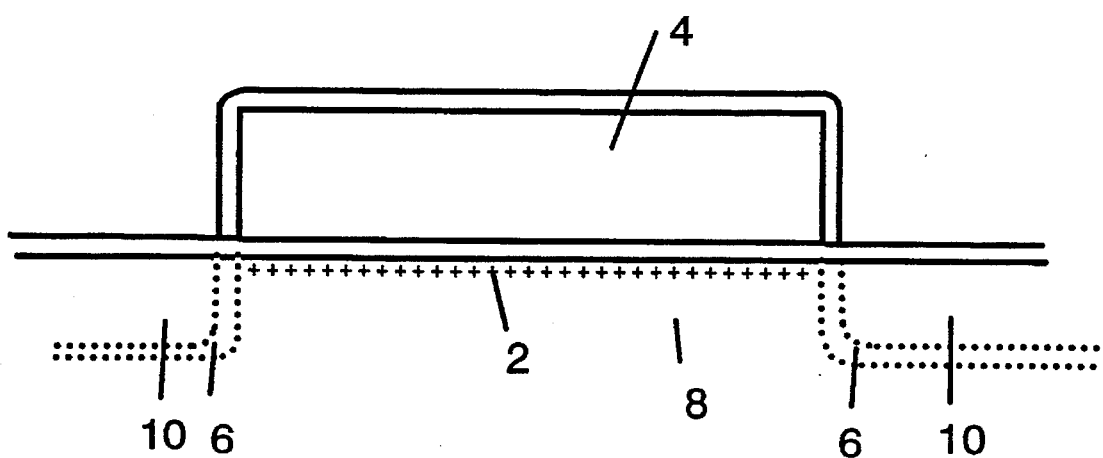
FIG. 1 is a cross-sectional view of a ROM transistor which shows the threshold adjust implant.
Figure 2A:
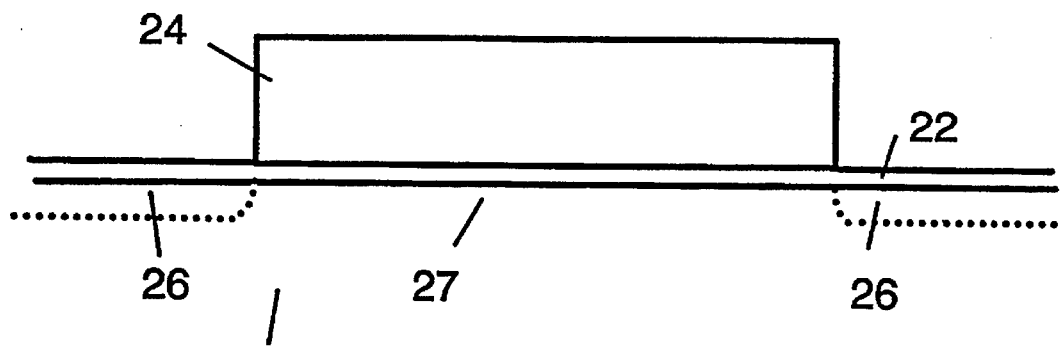
FIG. 2A is a cross-sectional view of structures on a silicon substrate showing a step in the forming of one type of memory cell.
Figure 2B:
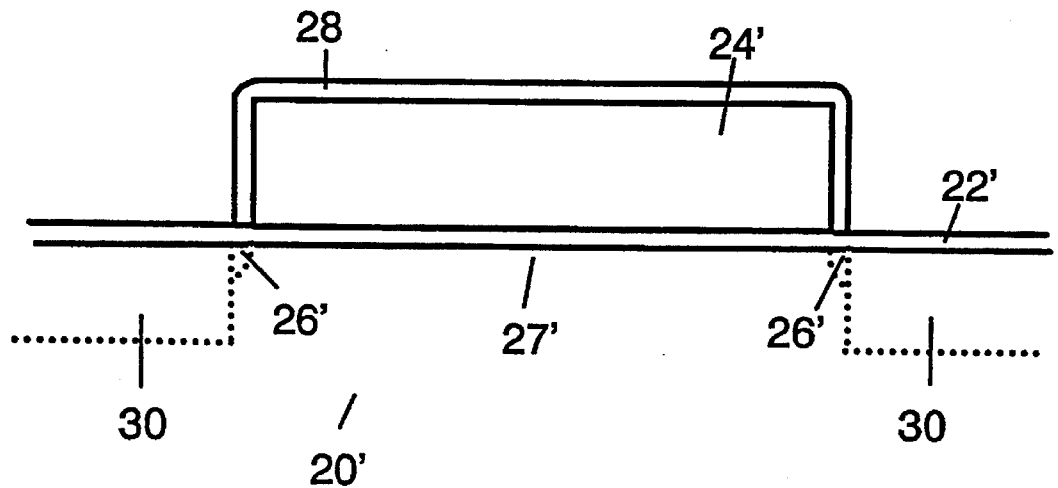
FIG. 2B is a cross-sectional view of one type of memory cell.

The forming of one type of memory cell in an embodiment of the present invention is shown in FIGS. 2A and 2B. FIG. 2A is a cross-sectional view of structures in the semiconductor substrate showing a step in forming one type of memory cell of the present invention. In the method of the present invention any well implant or threshold adjust implant is done before the forming of the polysilicon line 24. The threshold adjust implantation could be an implant of $10^{12}$ boron ions per square cm. This is a much smaller dosage than the dosage required for the lightly doped region or heavily doped region implants described below. Unlike in the method described with respect to FIG. 1, the threshold voltage implant for the present invention does not have to be very accurately aligned. Looking again at FIG. 2, polysilicon line 24 is formed on top of a thin oxide layer 22. Next, lightly doped regions 26 are formed in the silicon substrate 20. These lightly doped regions 26 are formed by a phosphorous ion implant through the thin oxide layer 22. The phosphorous ion implant is self-aligned with the polysilicon line 24. This means that the polysilicon line 24 is used to determine where the lightly doped regions 26 are formed in the silicon substrate 20. The polysilicon line 24 absorbs some of the phosphorous ions and prevents them from being placed into the channel 27 beneath the polysilicon line 24. A self-aligned lightly doped drain implant uses less silicon area to form the transistors. Process steps that are not self aligned have uncertainties of alignment which require additional silicon area as a safety margin.

The phosphorous ion implant step preferably has a dose of $2-9 * 10^{13}$ ions per square centimeter. In the preferred embodiment, the phosphorous ion implant step has a dose of $5 * 10^{13}$ ions per square centimeter. FIG. 2B is cross-sectional view of one type of memory cell of the present invention. A barrier oxide layer 28 is formed on top of the polysilicon line 24'. Next, an arsenic ion implant is done through the thin oxide layer 22'. This arsenic ion implant step preferably has a dose of $10^{15}-2*10^{16}$ ions per square centimeter. In the preferred embodiment, this arsenic ion implant step has a dose of $8*10^{15}$ ions per square centimeter. This arsenic ion implant is self-aligned to the barrier layer 28 such that a heavily doped region 30 in the semiconductor substrate 20' does not extend beneath the polysilicon line 24' and preferably does not extend beneath the barrier layer 28, except for lateral straggle effects. The barrier layer 28 prevents some of the arsenic ions in the implant from being implanted beneath the barrier layer 28. The heavily doped regions 30 are deeper than the lightly doped regions 26'. Heavily doped regions 30 and lightly doped regions 26' on either side of the polysilicon line 24' form a source and drain region. Notice that the lightly doped regions 26' extend beneath the barrier layer 28. Preferably, the lightly doped regions 26' do not extend beneath the polysilicon line 24'. The memory cell of one type shown in FIG. 2B is a ROM transistor with a normal threshold voltage.

Figure 3:
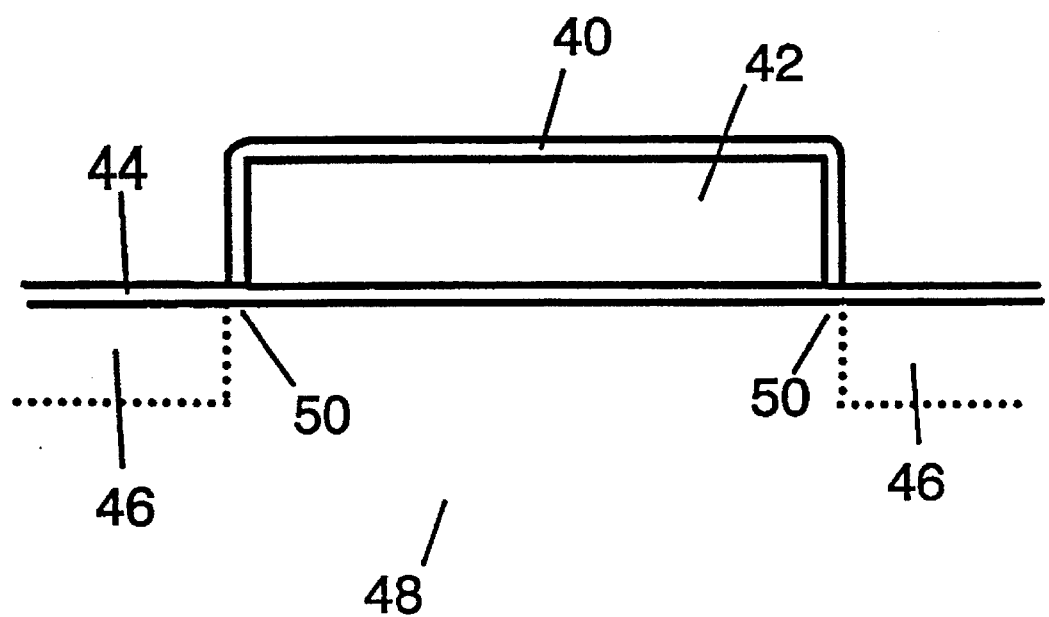
FIG. 3A is a cross-sectional view of another type of memory cell of the present invention.

FIG. 3 is a cross-sectional view of another type of memory cell. In this other type of memory cell, lightly doped regions are not formed. Photoresist (not shown) is placed over parts of certain memory locations, such as the memory location of the memory cell shown in FIG. 3, before the phosphorous ion implant. Phosphorous ions are not doped in the regions beneath the barrier layer 40. The polysilicon line 42 is formed overtop of the thin oxide layer 44. The barrier oxide layer 40 is formed on the polysilicon line 42. The heavily doped regions 46 are formed in the substrate 48 by an arsenic ion implant. Since lightly doped regions are not formed, isolation regions 50 exist beneath the barrier oxide layer 40. These isolation regions 50 located in the silicon substrate 48 in between the heavily doped regions 46, which act as the source and drain, and the polysilicon line 42 which acts as a gate. In preferred embodiment, the isolation regions 50 contain substantially no more donor atoms per cubic centimeter than the channel regions beneath the polysilicon lines 60. The channel region may contain donor and/or acceptor atoms due to a well implantation or a threshold adjust implantation. In effect, the isolation regions 50 produce a higher threshold of the ROM transistor. Because of the isolation regions 50, the source and drain regions do not conduct when voltages of between 5 and 5.5 volts are placed at the polysilicon line gate 42.

Figure 4A:
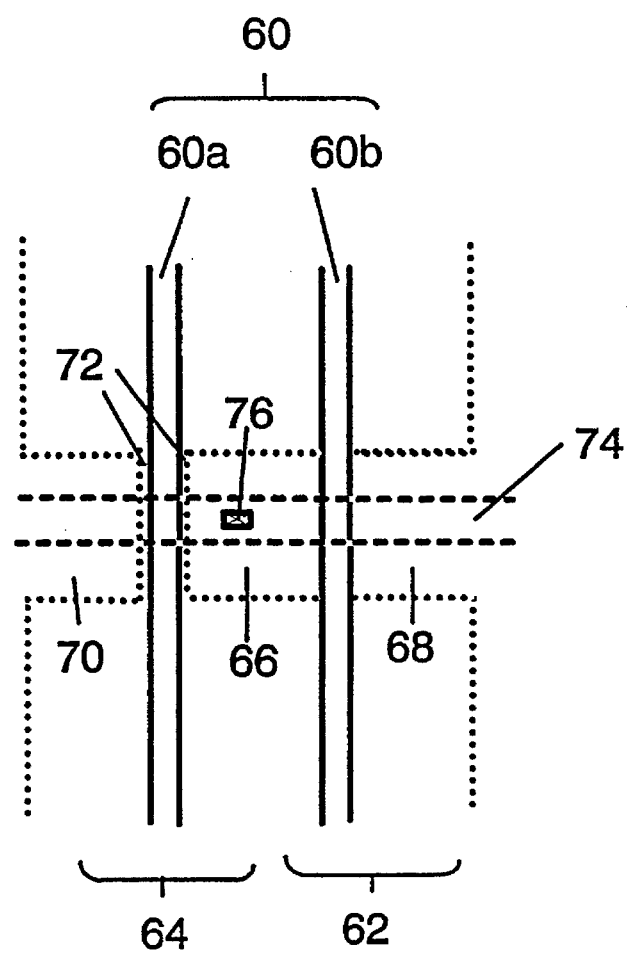
FIG. 4A is a top view of the ROM memory of the present invention.

FIG. 4A is a top view of the ROM memory of the present invention. In the ROM memory of the present invention, polysilicon lines 60 form the gates of the ROM transistors. Two ROM transistor memory cells 62 and 64 are shown at two memory locations on the silicon substrate. Some but not all of the memory cells have a lightly doped region formed in a self aligned manner with the polysilicon line as explained above. Memory cells of a first type, such as memory cell 62, are formed at memory locations where lightly doped regions are formed. Memory cell 62 is of a first type of memory cell such that the memory cell 62 conducts between the source 66 and the drain 68 when a voltage of between 5 and 5.5 volts is applied to the gate 60b. The source and drain regions 66 and 68 are comprised of the lightly doped region and the heavily doped region on either side of the polysilicon line 60b. The barrier oxide layers on top of the polysilicon lines 60 are not shown.

Memory cells of a second type, such as memory cell 64, are formed at memory locations where lightly doped regions are not formed. Memory cell 64 of the second type is shown with a source 66 and drain 70. The source 66 and drain 70 comprise a heavily doped region on either side of the polysilicon line 60a. In the forming of the ROM, a photoresist layer (not shown) covers at least the regions 72 which are part of the memory location of cell 64 during the lightly doped region implant. Since the lightly doped region is not formed in memory cell 64, the source 66 and drain 70 regions are comprised of the heavily doped region which is formed in a self-aligned manner with the barrier layer (not shown) on polysilicon line 60a. In this manner, isolation layers 72 are formed in the silicon substrate. The memory cell 64 is of the second type and does not conduct between the source 66 and the drain 70 when a signal voltage is placed on the polysilicon 60a because of the isolation regions 72. A metal layer 74 with contact 76 connects to the source region 66 for both of the memory cells.

Figure 4B:
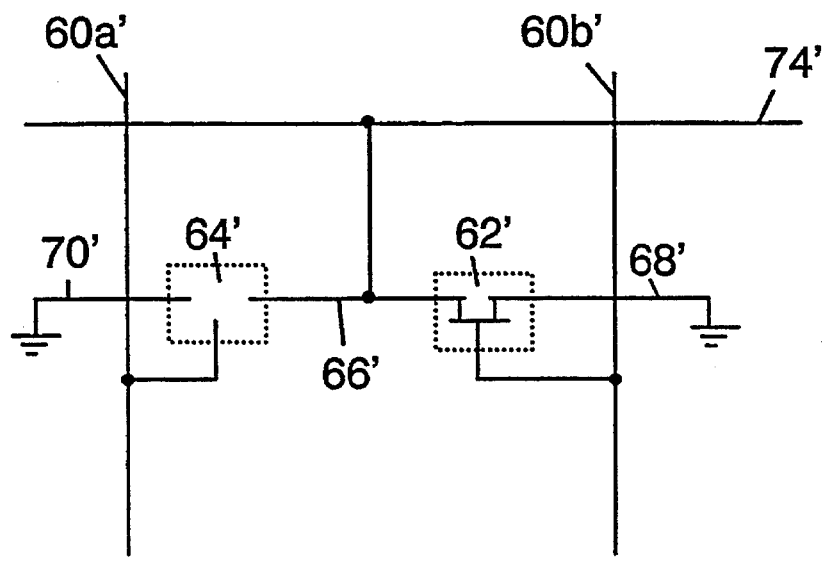
FIG. 4B is a schematic view of the ROM memory of FIG. 4A.

FIG. 4A is a schematic view of the ROM memory shown in FIG. 4B. This schematic shows how the ROM memory cells works at the normal signal level voltages. The metal layer 74' acts as a bit line for the ROM memory. The polysilicon lines 60a' and 60b' act as word lines. If word line 60b' has a signal voltage of around volts and the value on the metal bit line 74' is set high the ROM transistor memory cell 62' is turned on. When memory cell 62' is turned on, a sense amplifier (not shown) connected to bit line 74' can sense the current which flows through bit line 74' to the drain 68'.

Because of the isolation regions 72, the memory cells 64' have a threshold voltage above 5.5 volts so it is not turned on by signal voltages of around 5 volts. Since memory cell 64' can not be turned on by normal signal voltages on polysilicon line 60a', memory cell 64' is shown in FIG. 4B as being permanently off.

By using memory cells like memory cell 62' and memory cells like memory cell type 64', a read only memory can be produced. Those memory cells, like memory cell 62', through which a current flows when its bit and word lines are high can correspond to logical "1". Conversely, those memory cells, like memory cell 64', through which no current flows when its bit and word lines are high can correspond to logical "0".

Figure 5:
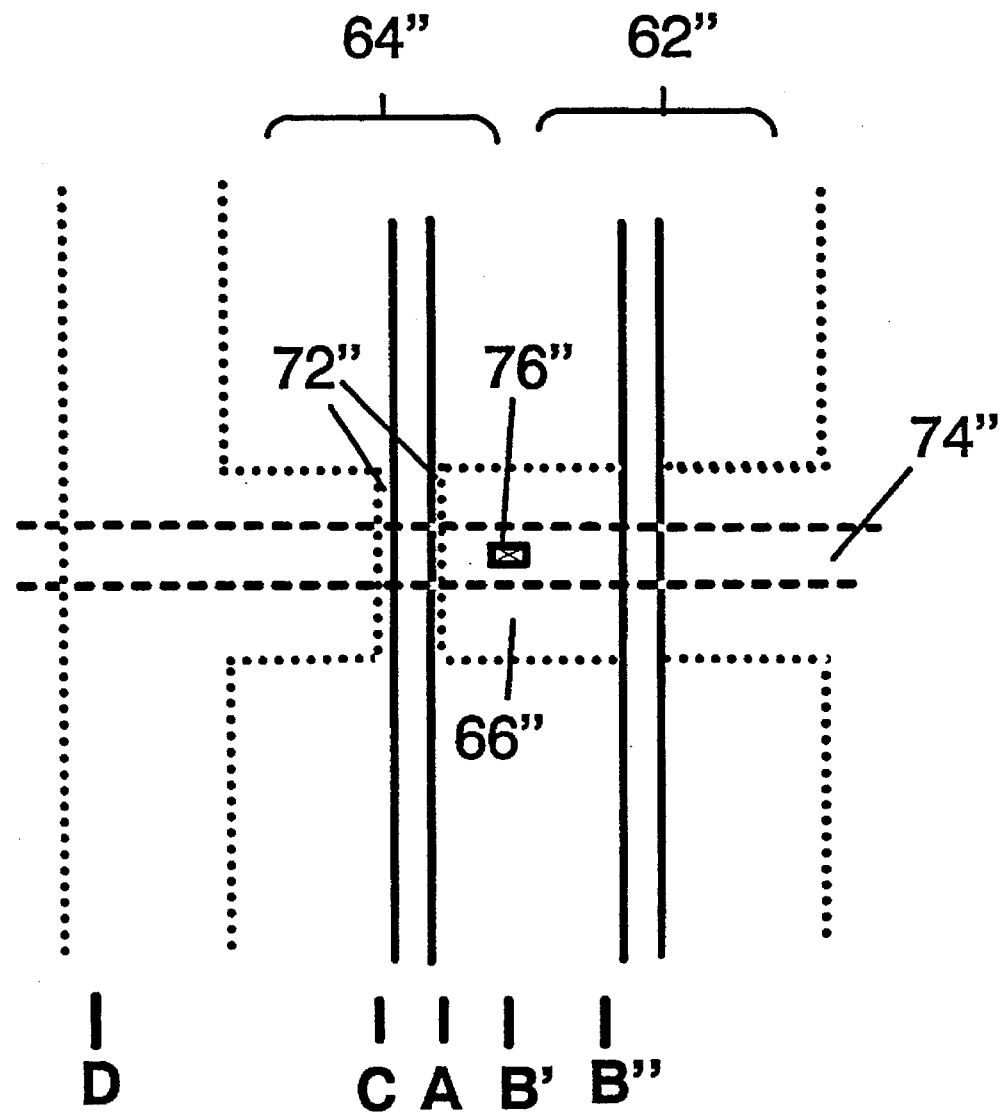
FIG. 5 is a top view showing the ROM memory of the present invention which illustrates a benefit of a preferred embodiment of the present invention.

FIG. 5 is a top view showing the ROM memory of the present invention which illustrates a benefit of the preferred embodiment of the present invention. A benefit of only masking the lightly doped regions as opposed to making both the lightly and heavily doped regions can be shown with respect to FIG. 5. If you placed photoresist onto the semiconductor wafer so as to block the lightly doped region for memory cell 64", you would want to cover the region between line C and line A. The photoresist however, must be placed such that any uncertainties in the alignment of the photoresist and the region between lines C and A must be covered. If only a lightly doped drain region is to be masked, the photoresist can be such a size that the worst possible alignment towards the right is that the photoresist extends between line C and line B". If the photoresist could possibly cross over line B", one of the lightly doped regions would not form around memory cell 62" as desired. However, if both the lightly doped drain and the heavily doped drain are to be masked, the photoresist can only be such a size that the worst possible alignment towards the right is that the photoresist extends between line C and line B'. Because the contact 76" must connect to the source 66", the region beneath the contact 76" can not be masked from the heavily doped region implant. The distance between line A and line B' may be less than the uncertainty in the mask process. If this is so and the heavily doped region is to be masked, memory cells 64" and 62" must be separated to increase the distance between line A and line B'. This increased separation would use up valuable silicon real estate. For this reason, the masking of only the lightly doped region implant is advantageous.

Figure 6:
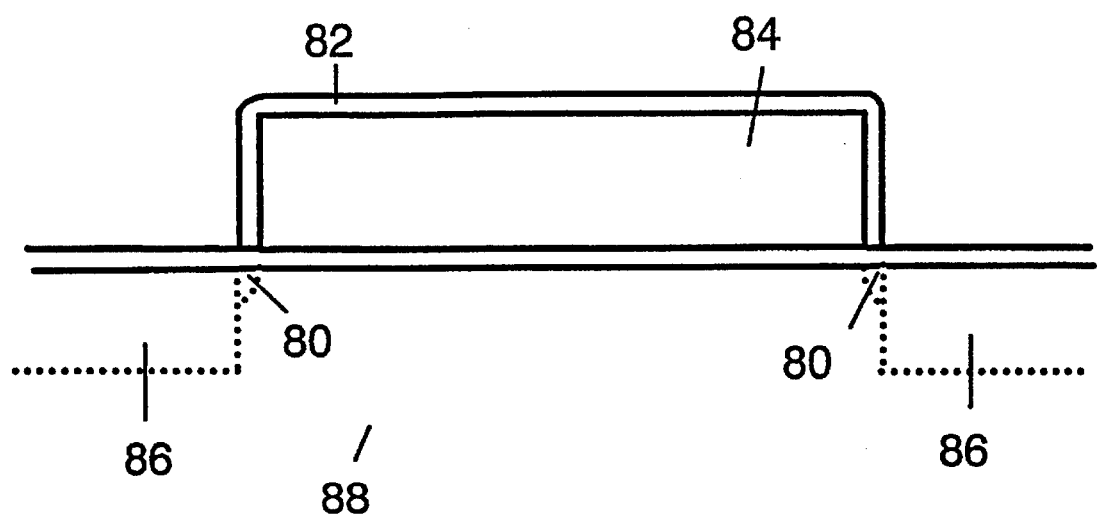
FIG. 6 is a cross-sectional view of a ROM memory cell formed with an alternate embodiment of the present invention.

In an alternate embodiment, an additional boron implantation may be made into the isolation regions instead of removing the lightly doped drain step. FIG. 6 is a cross-sectional view of a memory cell formed with this alternate embodiment of the present invention. Region 80 is doped with phosphorous ions in the lightly doped region implant step. No masking must be done before the lightly doped region implant step. Next, a photoresist masking is done to cover parts of the memory cells of the first type, that is memory cells which will become ROM transistors with normal threshold voltages. Memory cells of the second type, such as the cell shown in FIG. 6, are not masked. Because of the photoresist masking, some but not all of the memory locations have an acceptor ion implant into the lightly doped regions. This additional acceptor ion (boron ion) implant is then implanted into regions 80 self aligned with the polysilicon line 84. This additional boron ion implant can nullify the effects of the phosphorous doping so that region 80 is an isolation region. Isolation region 80 should contain the same number or more acceptor atoms (boron atoms) than donor atoms (phosphorous atoms). Next, the barrier layer 82 is formed on the polysilicon line 84. The heavily doped region 86 is formed in the silicon substrate 88 by a self aligned arsenic ion implant. Although acceptor ions are implanted into the heavily doped region 86 in the boron doping step, there is a much greater amount of donor (arsenic) atoms in the heavily doped region 86 than acceptor atoms because of the large arsenic ion implant. Because of the isolation region 80, the memory cell of FIG. 6 will not conduct between the source and drain when signal voltages of around 5 volts are placed on the gate. Using this alternate process, the other type of memory cells in which a lightly doped drain doped with donor atoms but not containing acceptor atoms are also formed. This other type of memory cell will act as a pass transistor with voltages of around 5 volts at the polysilicon gate. A possible disadvantage of this alternate method is the increased amount of dopants in the substrate.

Figure 7:
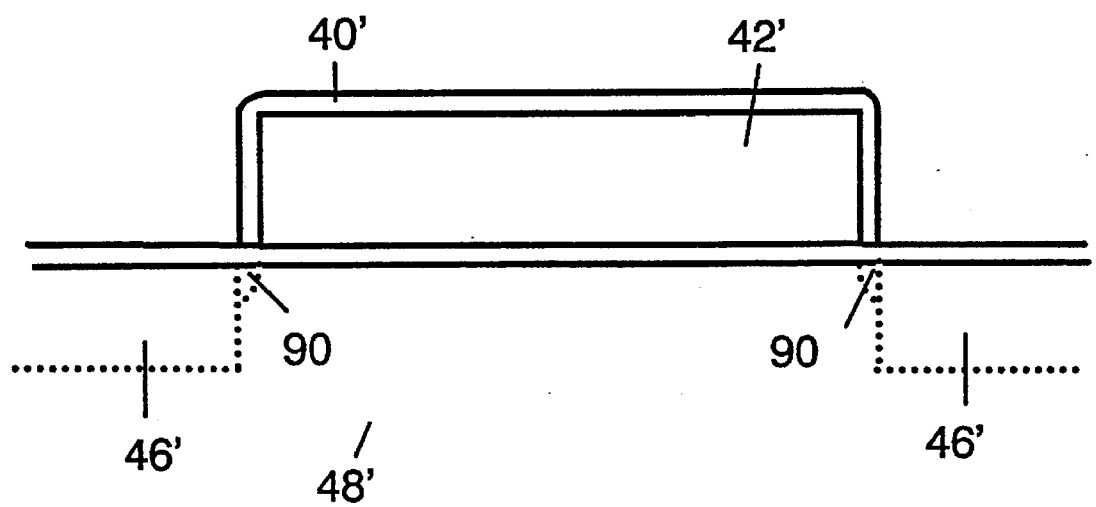
FIG. 7 is a cross-sectional view of a ROM memory cell formed with another alternate embodiment of the present invention.

Another alternate embodiment is to do an additional boron implantation into the isolation region in addition to not forming a lightly doped region with photoresist. FIG. 7 is a cross-sectional view of a ROM memory cell formed with this another alternate embodiment of the present invention. In this embodiment, the memory cells of the second type, such as the cell shown in FIG. 7, are masked before the lightly doped drain implant step. For this reason, phosphorous ions will not be implanted in region 90. Next, memory cells of the first type are masked and boron ions are implanted. The boron ions are implanted in isolation region 90. Next, the barrier layer 40' is formed on the polysilicon line 42' and then the heavily doped regions 46' are formed in the silicon substrate 48'. The isolation region 90 contains boron acceptor atoms but contains substantially no more donor atoms per cubic centimeter than the channel region beneath the polysilicon line 42'. The channel may contain donor and/or acceptor atoms due to a well implantation or a threshold adjust implantation. For these reasons, the memory cell of FIG. 7 will not conduct between the source and drain when signal voltages of around 5 volts are placed on the gate. The memory cells of the first type will have a structure like that of the memory cell shown in FIG. 2B. The memory cell of the first type has a self aligned phosphorous ion implant but does not have a boron ion implant due to photoresist masking. A disadvantage of this another alternate process is that it requires an additional masking step over the preferred embodiment or the alternate process.

The benefits of the present invention include its use with a single transistor memory cell read-only-memory and the ability to produce a high density read-only-memory. This mask programmable process is a mid-process mask programming process. All the steps up to the lightly doped region forming steps can be pre-done to form a stock of wafers. When the microcode on ROM memory needs to be changed, only the lightly doped region forming and later steps need to be done to a wafer from the stock of wafers.

Various details of the implementation and method are merely illustrative of the invention. It will be understood that various changes in such details may be within the scope of the invention, which is to be limited only by the appended claims.

What is claimed is:

1. A read-only-memory circuit including a plurality of memory cells on a silicon substrate comprising:

polysilicon lines;

barrier layers on top of and contacting the polysilicon lines;

doped regions in the silicon substrate on either side of at least some of the polysilicon lines, the doped regions comprising source and drain regions each including a lightly doped region with donor atoms in the substrate that extends beneath the barrier layer on the at least some of the polysilicon lines and a heavily doped region with donor atoms that does not extend beneath the at least some of the polysilicon lines wherein the heavily doped region is aligned with the barrier layer on the polysilicon line wherein the at least some of the polysilicon lines act as the gate of a pass transistor and wherein the gate and the source and drain regions comprise a memory cell of a first type such that when a signal voltage is applied to the gate, the cell of the first type conducts between the source and drain;

additional doped regions in the silicon substrate on either side of at least some others of the polysilicon lines, each additional doped region including an additional heavily doped region with donor atoms in the substrate that does not extend beneath the at least some others of the polysilicon lines; and isolation regions in the silicon substrate beneath the barrier layers on both sides of the at least some others of the polysilicon lines, the isolation regions do not contain substantially more donor atoms than acceptor atoms;

wherein the additional doped regions, the isolation regions and the at least some others of the polysilicon lines form memory cells of a second type, the memory cells of the second type are such that when the signal voltage is applied to one of the at least some others of the polysilicon lines, the cell of the second type does not significantly conduct between the additional doped regions.

2. The read-only-memory circuit of claim 1 further comprising a thin oxide layer on the silicon substrate, the thin oxide layer contacts the polysilicon lines.

3. The read-only-memory circuit of claim 1 wherein the barrier layers comprise an oxide layer on top of and contacting the polysilicon lines.

4. The read-only-memory circuit of claim 1 wherein the memory cells of the first type and the memory cells of the second type are such that the signal voltage is around 5 to 5.5 volts.

5. The read-only-memory circuit of claim 1 wherein the lightly doped regions in the substrate do not extend beneath the at least some of the polysilicon lines and the heavily doped regions in the substrate do not extend beneath the barrier layers on the at least some of the polysilicon lines and wherein the additional heavily doped region does not extend beneath the barrier layers on the at least some others of the polysilicon lines.

6. The read-only-memory circuit of claim 1 wherein the lightly doped regions are such that they include phosphorous atoms, and wherein the heavily doped regions and the additional heavily doped regions are such that they include arsenic atoms.

7. The read-only-memory circuit of claim 1 wherein the isolation region contains boron acceptor atoms that outnumber donor atoms in the isolation region.

8. The read-only-memory circuit of claim 7 wherein the isolation region contains boron acceptor atoms and substantially no more donor ions per cubic centimeter than a channel region beneath the polysilicon lines.

9. The read-only-memory circuit of claim 1 wherein the isolation region contains substantially no more acceptor atoms or donor atoms per cubic centimeter than a channel region beneath the polysilicon line.

10. The read-only-memory circuit of claim 1 wherein the concentration of donor atoms in the isolation regions is substantially the same as the concentration of donor atoms in the lightly doped drain regions.

11. The read-only-memory circuit of claim 1 wherein the isolation regions are aligned with the at least some others of the polysilicon lines.

12. A read-only-memory circuit including a plurality of memory cells on a silicon substrate comprising:

polysilicon lines;

barrier layers on top of and contacting the polysilicon lines;

doped regions in the silicon substrate on either side of at least some of the polysilicon lines, the doped regions comprising source and drain regions each including a lightly doped region with first dopant type atoms in the substrate that extends beneath the barrier layer on the at least some of the polysilicon lines and a heavily doped region with first dopant type atoms that does not extend beneath the at least some of the polysilicon lines wherein the heavily doped region is aligned with the barrier layer on the polysilicon line wherein the at least some of the polysilicon lines act as the gate of a pass transistor and wherein the gate and the source and drain regions comprise a memory cell of a first type such that when a signal voltage is applied to the gate, the cell of the first type conducts between the source and drain;

additional doped regions in the silicon substrate on either side of at least some others of the polysilicon lines, each additional doped region including an additional heavily doped region with first dopant type atoms in the substrate that does not extend beneath the at least some others of the polysilicon lines; and isolation regions in the silicon substrate beneath the barrier layers on both sides of the at least some others of the polysilicon lines, the isolation regions do not contain substantially more first dopant type atoms than second dopant type atoms;

wherein the additional doped regions, the isolation regions and the at least some others of the polysilicon lines form memory cells of a second type, the memory cells of the second type being such that when the signal voltage is applied to one of the at least some others of the polysilicon lines, the cell of the second type does not significantly conduct between the additional doped regions.

13. The read-only-memory circuit of claim 12, wherein the first dopant type atoms are donor atoms and where the second dopant type atoms are acceptor atoms.

14. The read-only-memory circuit of claim 12, wherein the isolation regions include both the first dopant type and the second dopant type atoms, the concentration of second dopant type atoms in the isolation regions is greater than the concentration of second dopant type atoms in the channel below the polysilicon lines.

* * * * *